US011553620B2

(12) United States Patent
Chen et al.

(10) Patent No.: US 11,553,620 B2
(45) Date of Patent: Jan. 10, 2023

(54) IMMERSION LIQUID COOLING ELLIPTICAL TANK ASSEMBLY

(71) Applicant: Quanta Computer Inc., Taoyuan (TW)

(72) Inventors: Chao-Jung Chen, Taoyuan (TW); Yu-Nien Huang, Taoyuan (TW); Tsung-Ta Li, Taoyuan (TW); Guo-Xiang Hu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/236,509

(22) Filed: Apr. 21, 2021

(65) Prior Publication Data

US 2022/0225527 A1     Jul. 14, 2022

Related U.S. Application Data

(60) Provisional application No. 63/137,468, filed on Jan. 14, 2021.

(51) Int. Cl.
*H05K 7/20*     (2006.01)

(52) U.S. Cl.
CPC ......... *H05K 7/203* (2013.01); *H05K 7/20318* (2013.01); *H05K 7/20327* (2013.01)

(58) Field of Classification Search
CPC ............... H05K 7/203; H05K 7/20236; H05K 7/20809; H05K 7/20772; H05K 7/20781; H05K 7/20818; H05K 7/20272; H05K 7/20327; H05K 7/20763; H05K 7/20381; H05K 7/20309; H05K 7/20; H05K 7/20281; H05K 7/2029; H05K 5/067; H05K 7/1497; H05K 7/20936; H05K 7/20736; H05K 7/208; G06F 1/20; G06F 2200/201; G06F 1/206; F28F 2265/12; F28F 3/12
USPC ... 165/104.33, 80.4, 104.21, 104.19, 104.27, 165/104.32, 281, 247; 361/699, 700, 361/679.53, 688, 696, 697, 704; 257/715, 257/714, E23.095, E23.098
See application file for complete search history.

(56) References Cited

U.S. PATENT DOCUMENTS

| | | | | |
|---|---|---|---|---|
| 9,686,887 B2* | 6/2017 | D'Onofrio | ......... | H05K 7/20218 |
| 10,750,637 B1* | 8/2020 | Alissa | ................ | H05K 7/20818 |
| 10,925,188 B1* | 2/2021 | Keehn | ............... | H05K 7/20754 |
| 2014/0183957 A1* | 7/2014 | Duchesneau | ......... | F01K 13/006 307/64 |
| 2014/0218859 A1* | 8/2014 | Shelnutt | ............ | H05K 7/20809 361/679.46 |
| 2015/0062806 A1* | 3/2015 | Shelnutt | ............. | H05K 7/20318 361/679.53 |
| 2018/0279500 A9* | 9/2018 | Wang | ................. | H05K 7/20818 |
| 2019/0159360 A1* | 5/2019 | Uchida | ............... | H05K 7/20327 |
| 2019/0357378 A1* | 11/2019 | Kolar | ................ | H05K 7/20327 |
| 2020/0093037 A1* | 3/2020 | Enright | ............. | H05K 7/20381 |
| 2020/0288600 A1* | 9/2020 | Gao | .................. | H05K 7/20263 |
| 2021/0410320 A1* | 12/2021 | Yang | ................. | H05K 7/20327 |

* cited by examiner

*Primary Examiner* — Mandeep S Buttar (74) *Attorney, Agent, or Firm* — Nixon Peabody LLP (57) ABSTRACT

An immersion liquid cooling tank assembly includes a generally elliptical tank, at least one condenser including a plurality of condenser tubes, at least one cooling fan adjacent to the condenser, a manifold system coupled to the at least one condenser to assist in distributing liquid flow to and from the plurality of condenser tubes, and a top cover disposed over the generally elliptical tank. The top cover includes an air baffle.

18 Claims, 5 Drawing Sheets

IMMERSION LIQUID COOLING ELLIPTICAL TANK ASSEMBLY

CROSS REFERENCE TO RELATED APPLICATIONS

This application claims priority from and benefit of U.S. Provisional Patent Application Ser. No. 63/137,468 filed on Jan. 14, 2021, titled "Elliptical Tank with Active Condense for Self-Recirculating Immersion Cooling Solution", the contents of which are hereby incorporated by reference herein in their entirety.

FIELD OF THE INVENTION

The present invention relates generally to cooling systems, and more specifically, to tank assemblies that assist in cooling heat-generating components, such as those in servers.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Overheating from the inefficient removal of such heat has the potential to shut down or impede the operation of such devices. Due to the improvement of high-performance systems, the amount of heat that needs to be removed becomes higher with each new generation of electronic components. With the advent of more powerful components, traditional air cooling in combination with fan systems alone is inadequate to sufficiently remove heat generated by newer generation components.

Liquid cooling is the currently accepted solution for rapid heat removal due to the superior thermal performance from liquid cooling. Liquid cooling is more effective in absorbing and transporting heat from the heat-generating components, and allows heat removal with reduced or no noise pollution. In an immersion liquid cooling system, heat-generating components, such as servers, switches, and storage devices, will be immersed in a tank holding coolant. One existing type of immersion tank is a passive, rectangular-shaped immersion tank. This existing type of tank has disadvantages in terms of circulation of the coolant, and the associated inefficiencies resulting therefrom.

Thus, there is a need for an immersion liquid cooling tank assembly that overcomes one or more of such disadvantages.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, an immersion liquid cooling tank assembly includes a generally elliptical tank, at least one condenser including a plurality of condenser tubes, at least one cooling fan adjacent to the condenser, a manifold system coupled to the at least one condenser to assist in distributing liquid flow to and from the plurality of condenser tubes, and a top cover disposed over the generally elliptical tank. The top cover includes an air baffle.

According to a configuration of the above implementation, the at least one condenser is a plurality of condensers in which each of the plurality of condensers includes a plurality of condenser tubes.

According to another configuration of the above implementation, the at least one cooling fan is a plurality of cooling fans, each of the plurality of cooling fans is located adjacent to one of the plurality of condensers.

In another implementation, the exterior shape of the air baffle has a generally V-form. It is contemplated that the exterior shape of the air baffle has a general pointed area with two diverging quarter circle extending in opposing directions from the general pointed area.

In yet another implementation, the generally elliptical tank comprises a metallic material.

In a further implementation, the generally elliptical tank is elliptical.

In a further implementation, the generally elliptical tank further includes a fixed bracket adjacent to an exterior surface of the generally elliptical tank.

In another further implementation, the immersion liquid cooling tank assembly further includes a coolant located and contained within the generally elliptical tank. The coolant in one embodiment may be a fluorocarbon and in another embodiment, the coolant is water or a mixture including water.

In a further implementation, the immersion liquid cooling tank assembly further includes a plurality of heat-generating components contained within the generally elliptical tank. The plurality of heat-generating components includes one or more of storage servers, application servers, switches, and other electronic devices.

In a further implementation, the immersion liquid cooling tank assembly further includes a support structure that is located and configured within the generally elliptical tank to abut and support heat-generating components.

According to another aspect of the present disclosure, an immersion liquid cooling tank assembly includes a generally elliptical tank, a plurality of condensers, a plurality of cooling fans, a manifold system, a top cover, a coolant, and a plurality of heat-generating components. Each of the plurality of condensers includes a plurality of condenser tubes. Each of the plurality of cooling fans is located adjacent to a respective one of the plurality of condensers. The manifold system is coupled to the plurality of condensers to assist in distributing liquid flow to and from the plurality of condenser tubes. The top cover is disposed over the generally elliptical tank. The top cover includes an air baffle. The coolant and the plurality of heat-generating components are contained within the generally elliptical tank.

In a further aspect of the above implementation, the exterior shape of the air baffle is generally V-shaped. In another implementation, the exterior shape of the air baffle has a general pointed area with two diverging quarter circle extending in opposing directions from the general pointed area.

In a further implementation, the plurality of heat-generating components includes storage servers, application servers, switches, or other electronic devices.

In yet another implementation, an immersion liquid cooling tank assembly further includes a fixed bracket adjacent to an exterior surface of the generally elliptical tank.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

According to one aspect of the present disclosure, an immersion liquid cooling tank assembly includes a generally elliptical tank, at least one condenser including a plurality of condenser tubes, at least one cooling fan adjacent to the condenser, a manifold system coupled to the at least one condenser to assist in distributing liquid flow to and from the plurality of condenser tubes, and a top cover with an air baffle.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
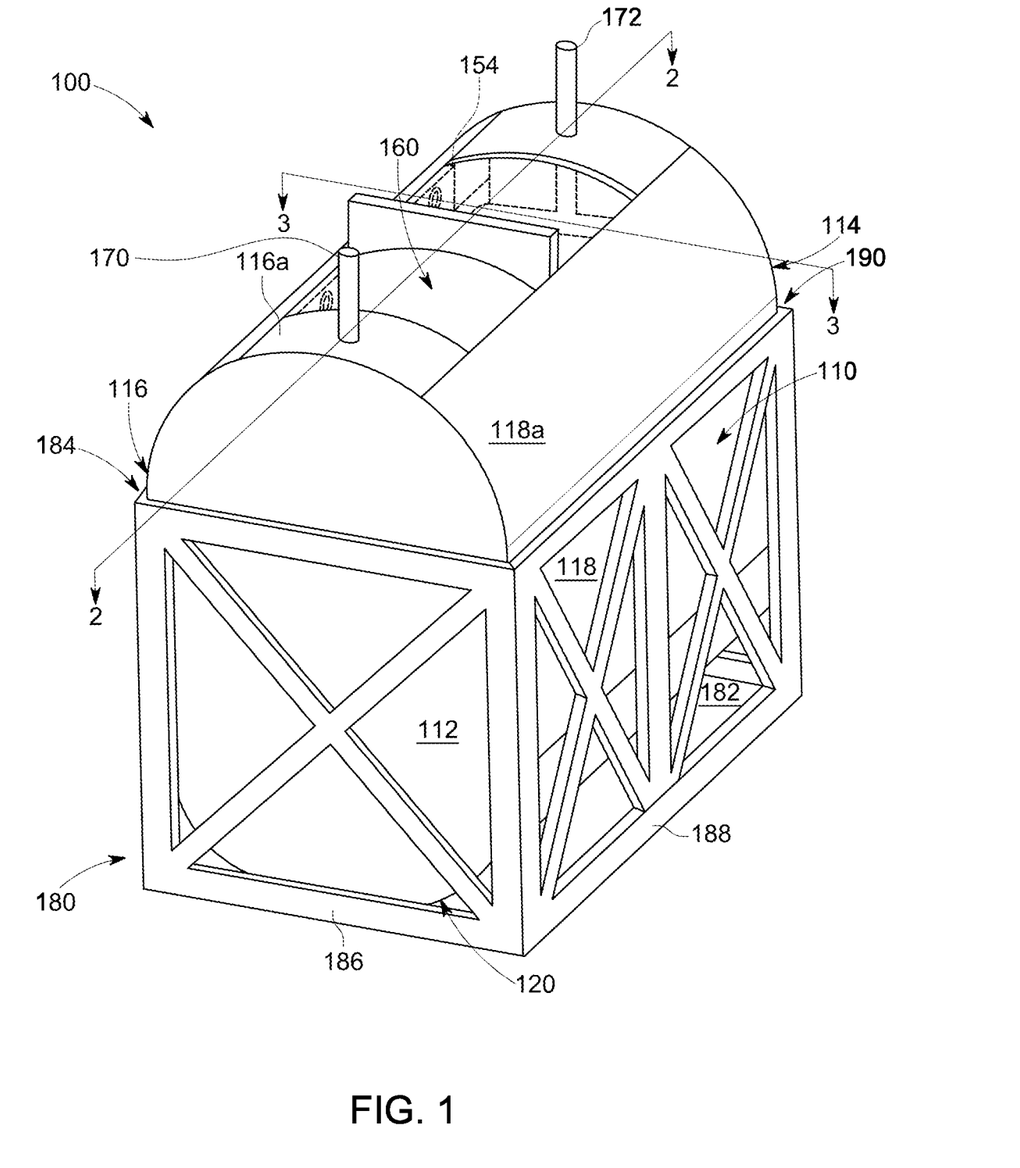
FIG. 1 is a generally perspective view of an immersion liquid cooling tank assembly, in accordance with one embodiment of the present disclosure.
Figure 2:
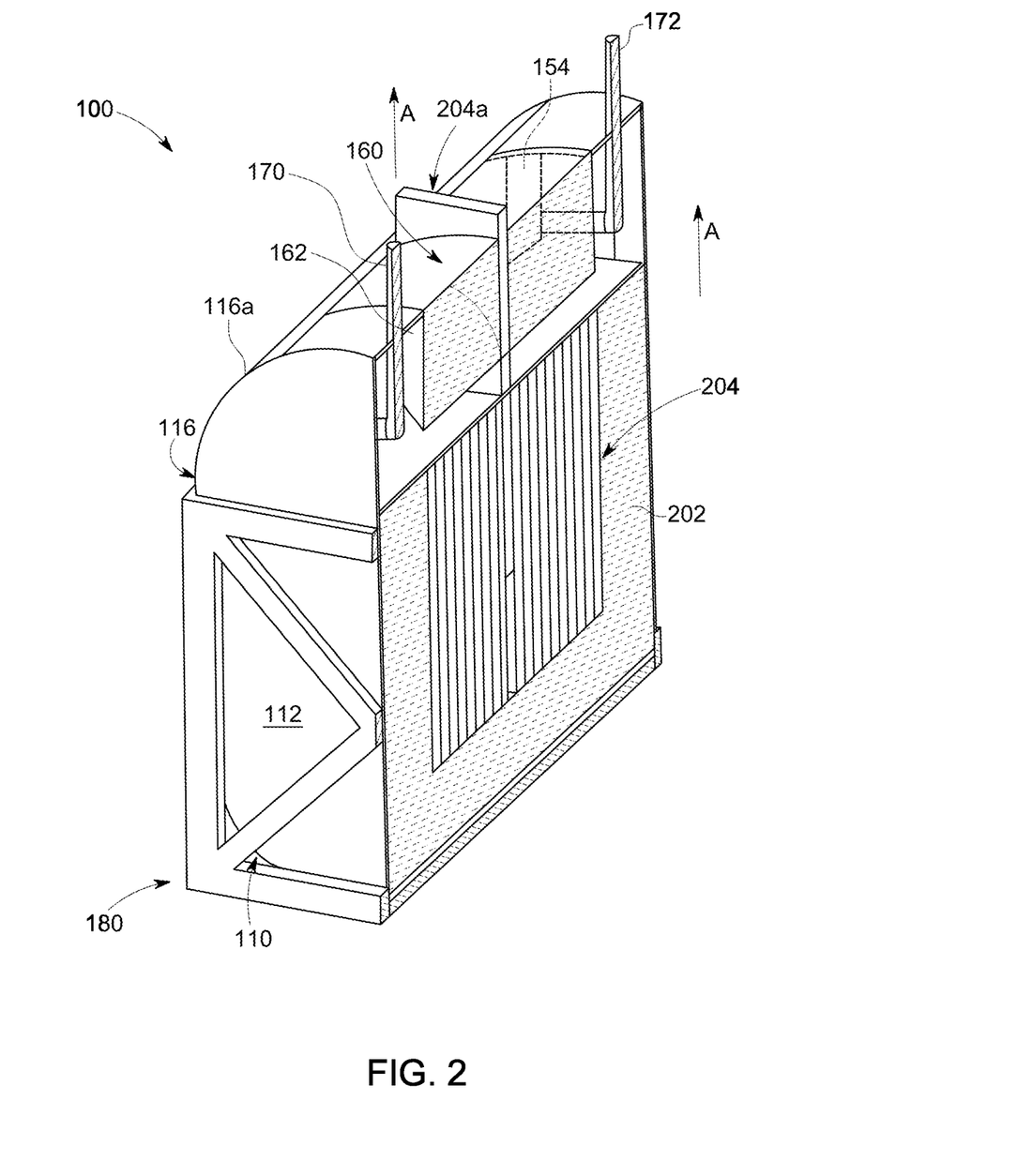
FIG. 2 is a cross-sectional view taken generally across line 2-2 of FIG. 1.
Figure 3:
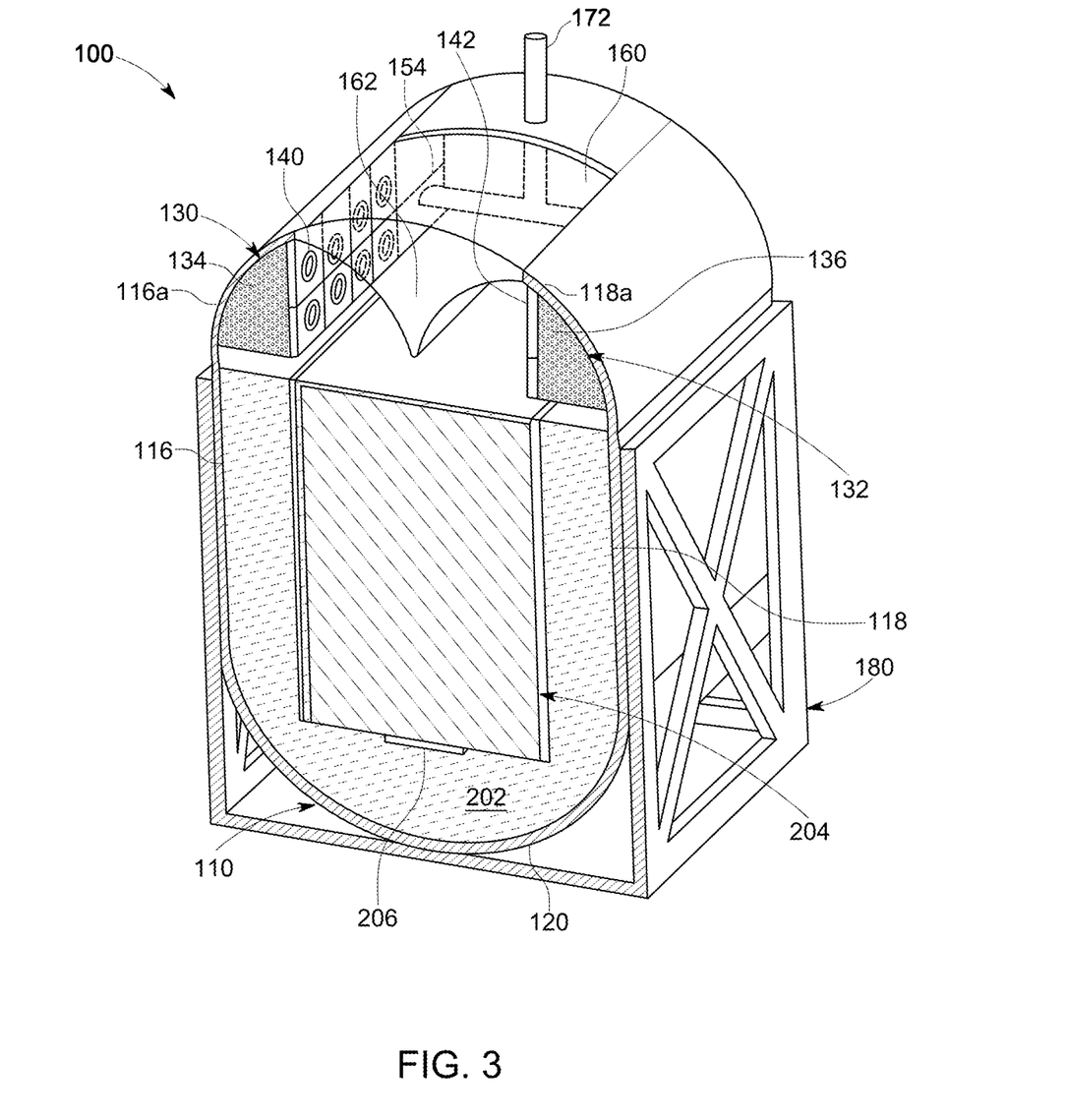
FIG. 3 is a cross-sectional view taken generally across line 3-3 of FIG. 1.

FIG. 1 is a generally top perspective view of an immersion liquid cooling elliptical tank assembly 100, according to one embodiment of the present disclosure. FIGS. 2 and 3 are two cross-sectional views of the immersion liquid cooling tank assembly 100 from FIG. 1. The immersion liquid cooling tank assembly 100 is configured to contain and cool heat-generating components, as will be discussed below. Non-limiting examples of heat-generating components that may be contained within the immersion liquid cooling tank assembly include, but are not limited to, storage servers, application servers, switches, or other electronic devices. Examples include, but are not limited to, central processing units (CPU), dual in-line memory modules (DIMM), network cards, a hard disk drives (HDD), solid state drives (SSD), graphics processing units (GPU) or field programmable gate arrays (FPGA). It is contemplated that other heat-generating components may be contained within the immersion liquid cooling tank assembly.

Referring to FIGS. 1-4, the immersion liquid cooling tank assembly 100 includes a generally elliptical tank 110, a plurality of condensers 130, 132, a plurality of cooling fans 140, 142, a manifold system 150, and a top cover 160 with an air baffle 162 in one embodiment. The immersion liquid cooling tank assembly 100 further includes a fixed bracket 180 that is adjacent to an exterior surface of the generally elliptical tank 110.

The generally elliptical tank 110 in one embodiment is an elliptical tank as shown best in FIG. 1. The generally elliptical tank has a first end 112, a second opposing end 114, a bottom section 120, and a plurality of side walls 116, 118. The second opposing end 114 is sized and shaped the same as the first end 112. The bottom section 120 is slightly widened or flattened (see also FIG. 3). The plurality of side walls 116 extends upwardly and inwardly to form a generally top section 116a. Similarly, the plurality of side walls 118 extends upwardly and inwardly to form a generally top section 118a.

Figure 4:
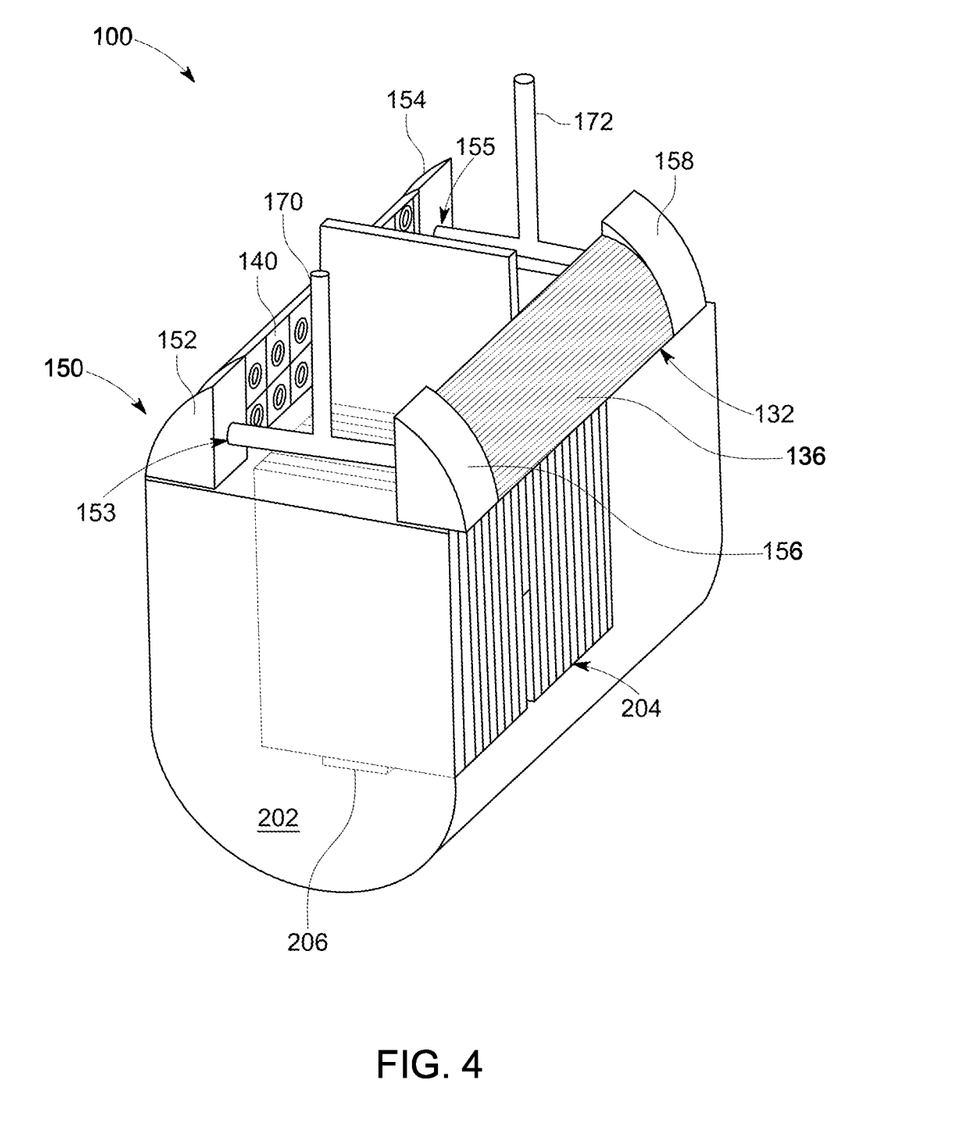
FIG. 4 is a generally perspective view of the immersion liquid cooling tank assembly of FIG. 1 with top cover, bracket and generally elliptical tank removed for clarity.
Figure 5:
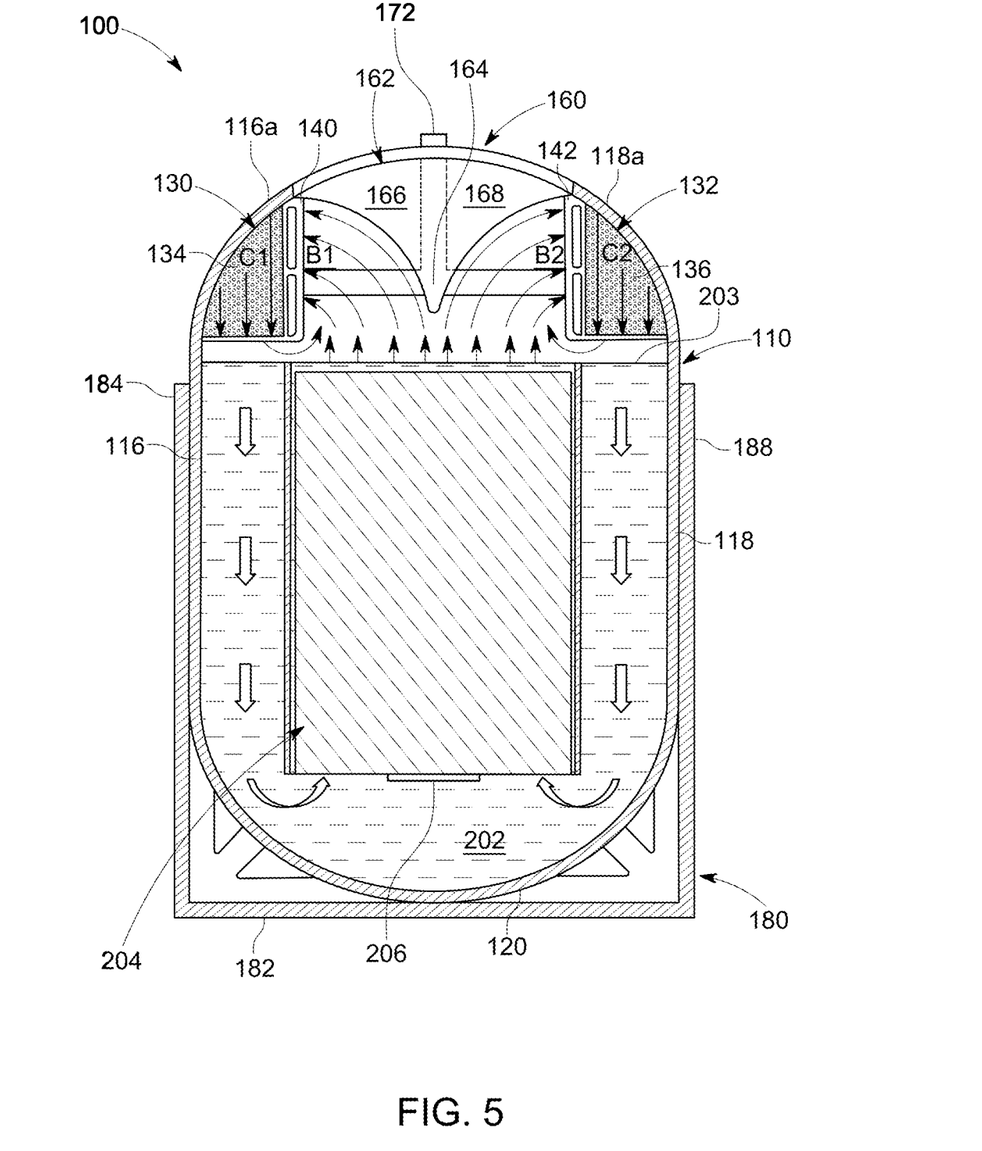
FIG. 5 is a generally cross sectional side view taken generally along a middle of the immersion liquid cooling tank assembly of FIG. 1.

Referring to FIGS. 3-5, the immersion liquid cooling tank assembly 100 includes the plurality of condensers 130, 132 with an internal network of fluid conduits. The fluid conduits used in the condensers 130, 132 are in the form of respective condenser tubes 134, 136 in one embodiment. The plurality of condenser tubes 134, 136 used in the respective condensers 130, 132 is desirable because of their efficiency in the cooling of the coolant from its vapor phase to its liquid phase, as will be discussed below.

The plurality of condenser tubes 134, 136 used in the condensers 130, 132 extends between opposing ends of the manifold system 150. More specifically, referring to FIGS. 3 and 4, the plurality of condenser tubes 134 used in the condenser 130 extends between a first manifold portion 152 to an opposing second manifold portion 154. The plurality of condenser tubes 136 used in the condenser 132 extends between a third manifold portion 156 to an opposing fourth manifold portion 158. The plurality of condenser tubes 134, 136 in the condensers 130, 132 assists in containing and transporting a liquid therethrough. The liquid in the plurality of condenser tubes 134, 136 is configured to receive or absorb transferred heat from the coolant (vapor phase), as will be discussed below. The plurality of condenser tubes may be of various sizes and shapes. In a non-limiting embodiment, each of the plurality of condenser tubes has a generally circular shape. In another non-limiting embodiment, each of the plurality of condenser tubes has a generally oval shape.

It is contemplated that the plurality of condenser tubes may have other shapes including polygonal shapes or other non-polygonal shapes. For example, the plurality of condenser tubes may have a cross-section being a polygonal shape (e.g., a square or a rectangle). It is, of course, desirable for the plurality of condenser tubes to be shaped and sized for effective heat transfer with the coolant (vapor phase).

The exterior shape of the condensers 130, 132 shown in FIG. 3 has a generally quarter circular form. This exterior shape of the condenser 130, 132 shown in FIG. 3 is desirable for a heat-transfer area that allows for a greater and quicker heat transfer between the coolant (vapor phase) and the condensers 130, 132.

The immersion liquid cooling tank assembly 100 includes exactly two condensers 130, 132 as shown in FIGS. 3 and 5. It is contemplated that an immersion liquid cooling tank assembly may include at least one condenser. It is contemplated that the immersion liquid cooling tank assembly may include two or more condensers. The number of condensers would be dependent on the desired cooling capabilities of the immersion liquid cooling tank assembly. The desired cooling capabilities would depend on factors such as the number and size of the heat-generating components, the size of the immersion liquid cooling tank assembly, and the type and amount of coolant being used.

As shown in FIG. 4, the condenser 132 extends from the third manifold portion 156 to the opposing fourth manifold portion 158 of the manifold system 150. The condenser 130 also extends from the first manifold portion 152 to the opposing second manifold portion 154 of the manifold system 150. The manifold system 150 is coupled to the condensers 130, 132 to assist in distributing liquid flow to and from the plurality of condenser tubes. The first and third manifold portions 152, 156 handle and distribute cold liquid (e.g., water), while the second and the fourth manifold portions 154, 156 handle and consolidate removal of the hot liquid (e.g., water).

The first manifold portion 152 in FIG. 4 has at least one larger opening 153 that is in fluid communication with cold liquid piping 170. The cold liquid piping 170 contains cold liquid (e.g., water) that enters the at least one larger opening 153 in the first manifold portion 152. The first manifold portion 152 further includes a plurality of openings formed therein to receive and distribute the cold liquid to the plurality of condenser tubes 134 of the condenser 130.

The third manifold portion 156 has at least one larger opening that is in fluid communication with the cold liquid piping 170. The cold liquid piping 170 contains cold liquid (e.g., water) that enters the at least one larger opening in the third manifold portion 156. The third manifold portion 156 further includes a plurality of openings formed therein to receive and distribute the cold liquid to the plurality of condenser tubes 136 of the condenser 132.

The second manifold portion 154 has at least one larger opening 155 in FIG. 4 that is in fluid communication with hot liquid piping 172. The hot liquid piping 172 removes hot liquid (e.g., water) that enters the at least one larger opening 155 in the second manifold portion 154. The second manifold portion 154 further includes a plurality of openings formed therein that collects and consolidates the hot liquid from the plurality of condenser tubes 134 to be removed via the hot liquid piping 172. The hot liquid piping 172 carries away the heat generated from the heat-generating components.

The fourth manifold portion 158 has at least one larger opening that is in fluid communication with the hot liquid piping 172. The hot liquid piping 172 removes hot liquid (e.g., water) that enters the at least one larger opening in the fourth manifold portion 158. The fourth manifold portion 158 further includes a plurality of openings formed therein that collects and consolidates the hot liquid from the plurality of condenser tubes 136 to be removed via the hot liquid piping 172.

The exterior shape of each of the manifold portions 152, 154, 156, 158 shown in FIG. 4 has a generally quarter circular form. This exterior shape of the manifold portions 152, 154, 156, 158 generally corresponds with the exterior shape of the condensers 130, 132. It is contemplated that the manifold portions may be of different shapes and/or sizes.

The immersion liquid cooling tank assembly 100 includes a plurality of cooling fans 140, 142 as shown, for example, in FIG. 3. The cooling fans 140, 142 assist in controlling the vapor and liquid ratio of the coolant 202 and increase the total heat exchange of the respective condensers 130, 132. By changing the fan speed, the cooling fans 140, 142 control the vapor coolant pressure such that the coolant can circulate efficiently and increase the maximum heat dissipation of the immersion liquid cooling tank assembly 100.

The immersion liquid cooling tank assembly 100 further includes a top cover 160. Referring back to FIGS. 1 and 2, the top cover 160 assists in providing a closed environment or system for the immersion liquid cooling tank assembly 100.

The top cover 160 is moveable or removable to gain access to the heat-generating components contained with the generally elliptical tank 110. The top cover 160 seals the generally elliptical tank 110 to prevent or inhibit the coolant from evaporating. To assist in moving the top cover 160 between open and closed positions, a hinge may be used. It is contemplated that other mechanisms besides hinges may be used to assist in gaining access to the plurality of heat-generating components.

The top cover 160 includes the air baffle 162 as shown best in FIGS. 3 and 5. The exterior shape of the air baffle 162 has a generally V-form in one embodiment. The exterior shape of the air baffle 162 has a general pointed area 164 with two diverging quarter circle portions 166, 168 extending in opposing directions from the general pointed area 164. The air baffle 162 assists in circulating the coolant (vapor phase) ultimately to the condensers 130, 132. The air baffle 162 is smoothly curved and streamlines the circulation of the coolant (vapor phase).

It is contemplated that at the top cover may be configured differently than shown in FIGS. 1 and 2 in other embodiments. For example, the top cover may include multiple portions (i.e., a plurality of top covers) in which one or more can be removed or moved to gain access to an interior of the generally elliptical tank.

As shown best in FIG. 1, immersion liquid cooling tank assembly 100 includes a fixed bracket 180. The fixed bracket 180 is a structure that contains and provides improved stability to the generally elliptical tank 110. The fixed bracket 180 is located adjacent to the external surface of the generally elliptical tank 110. The fixed bracket 180 has a bottom section 182 and a plurality of walls 184, 186, 188, 190 extending generally from the bottom section 182. It is contemplated that other structures may be used in assisting in stabilizing the generally elliptical tank.

Referring back to FIGS. 2 and 3, the immersion liquid cooling tank assembly 100 includes the coolant 202 and a plurality of heat-generating components 204 located and contained within the generally elliptical tank 110. The coolant 202 may be selected from a variety of coolants to assist in removing heat generated from the plurality of heat-generating components 204 by directly contacting those components. In one embodiment, the coolant is a thermally-conductive, dielectric liquid coolant. The coolant 202 assists in removing heat generated from the heat-generated components 204 by directly contacting those components. The liquids used as the coolant typically have very good insulating properties so that contact with the heat-generated components can be accomplished in a safe manner. The coolant 202 changes between its liquid and vapor phases easily and at a desired temperature.

The type of coolant is selected based on the requirement of thermal design. Non-limiting examples of coolants include fluorocarbons, water (e.g., deionized water, mixtures including water, and hydrocarbons. It is contemplated that other coolants may be used that can remove and absorb heat from the heat-generating components being stored within the generally elliptical tank.

The plurality of heat-generating components 204 shown in FIG. 2 is a plurality of servers. One of the heat-generating components 204 (heat-generating component 204a) is shown in the process of being removed from the generally elliptical tank 110. The heat-generating component 204a is being removed along the general direction of arrow A. As discussed above, the top cover 160 would need to be moved from a closed position to an open position so as to gain access to the plurality of heat-generating components 204. The top cover 160 is depicted as being in a closed position in FIG. 2. Non-limiting examples of heat-generating components that may be contained within the immersion liquid cooling tank assembly include, but are not limited to, storage servers, application servers, switches, or other electronic devices. Examples include, but are not limited to, CPU, DIMM, network card, a HDD, SSD, GPU or FPGA.

As shown in FIG. 3, for example, the plurality of heat-generating components 204 rests on a support structure 206. The support structure 206 extends longitudinally from the first end 112 to the second opposing end 114 of the generally elliptical tank 110 in one embodiment. The support structure 206 is configured to support and position the plurality of heat-generating components 204. The support structure 206 is also configured to abut the plurality of heat-generating components 204.

The process of heat transfer is shown best in FIG. 5, which is a generally cross-sectional side view taken generally along a middle of the immersion liquid cooling tank assembly 100 of FIG. 1. The immersion liquid cooling tank assembly is configured to be used in a two-phase immersion process. In this process, a two-phase temperature evaporation process cools the heat-generating components via the coolant 202. The coolant 202 in FIG. 5 surrounds or substantially surrounds the plurality of heat-generating components 204. The level of the coolant 202 is shown with reference to coolant level 203. As the coolant 202 (liquid phase) contacts the plurality of heat-generating components 204, molecules of the coolant in the liquid phase become gaseous molecules of coolant. These plurality of gaseous coolant molecules as depicted in FIG. 5 move in the general direction of arrow B1 or arrow B2. As the gaseous molecules travel in the general direction of either arrow B1 or B2, the gaseous molecules contact one of the condensers 130, 132. After contacting one of the condensers 130, 132, the gaseous coolant molecules are quickly transformed into liquid coolant molecules. These plurality of liquid coolant molecules, as depicted in FIG. 5, move in the general direction of arrow C1 or arrow C2 back to the coolant bath.

The generally elliptical tank 110 comprises a metallic material. Non-limiting metallic materials that may be used in forming the generally elliptical tank include steel. Examples of steel that may be used in forming the generally elliptical tank include, but are not limited to, stainless steel, and cold-rolled steel such as SGCC steel. It is contemplated that other materials besides metallic material may be used in forming the generally elliptical tank, if such materials have the desired properties including strength to hold the material inside. The support structure 206 may be formed using the same material as the material used in forming the generally elliptical tank 110.

In another embodiment, it is contemplated that the generally elliptical tank may include components that assist in circulating the coolant (liquid phase) within the generally elliptical tank to assist in improving the heat transfer of the coolant (liquid phase) and the heat-generating component. Such components for circulating the coolant (liquid phase) within the tank may include at least one stirrer, at least one pump, or other devices.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An immersion liquid cooling tank assembly comprising: a generally elliptical tank; at least one condenser including a plurality of condenser tubes; at least one cooling fan adjacent to the condenser; a manifold system coupled to the at least one condenser to assist in distributing liquid flow to and from the plurality of condenser tubes; and a top cover disposed over the generally elliptical tank, the top cover including an air baffle, wherein the at least one condenser is located adjacent to the top cover and the at least one cooling fan is adjacent to the top cover; and wherein the exterior shape of the at least one condenser has a generally quarter circular form.

2. The tank assembly of claim 1, wherein the at least one condenser is a plurality of condensers, each of the plurality of condensers including a plurality of condenser tubes, each of the plurality of condensers being located adjacent to the top cover.

3. The tank assembly of claim 2, wherein the at least one cooling fan is a plurality of cooling fans, each of the plurality of cooling fans located adjacent to one of the plurality of condensers and the top cover.

4. The tank assembly of claim 1, wherein the exterior shape of the air baffle has a generally V-form.

5. The tank assembly of claim 1, wherein the exterior shape of the air baffle has a general pointed area with two diverging quarter circle extending in opposing directions from the general pointed area.

6. The tank assembly of claim 1, wherein the tank is elliptical.

7. The tank assembly of claim 1 further including a fixed bracket adjacent to an exterior surface of the generally elliptical tank.

8. The tank assembly of claim 1 further including a coolant located and contained within the generally elliptical tank.

9. The tank assembly of claim 8, wherein the coolant is a fluorocarbon.

10. The tank assembly of claim 8, wherein the coolant is water or a mixture including water.

11. The tank assembly of claim 1 further including a plurality of heat-generating components contained within the generally elliptical tank.

12. The tank assembly of claim 11, wherein the plurality of heat-generating components includes one or more of storage servers, application servers, switches, and other electronic devices.

13. The tank assembly of claim 1 further including a support structure that is located and configured within the generally elliptical tank to abut and support heat-generating components.

14. An immersion liquid cooling tank assembly comprising: a generally elliptical tank; a plurality of condensers, each of the plurality of condensers including a plurality of condenser tubes; a plurality of cooling fans, each of the plurality of cooling fans located adjacent to a respective one of the plurality of condensers; a manifold system coupled to the plurality of condensers to assist in distributing liquid flow to and from the plurality of condenser tubes; a top cover disposed over the generally elliptical tank, the top cover including an air baffle; a coolant contained within the generally elliptical tank; and a plurality of heat-generating components contained within the generally elliptical tank, wherein the plurality of condensers is located adjacent to the top cover and the plurality of cooling fans is adjacent to the top cover; and wherein each of plurality of condensers has an external shape being a generally quarter circular form.

15. The tank assembly of claim 14, wherein the exterior shape of the air baffle has a generally V-form.

16. The tank assembly of claim 14, wherein the exterior shape of the air baffle has a general pointed area with two diverging quarter circle extending in opposing directions from the general pointed area.

17. The tank assembly of claim 14, wherein the plurality of heat-generating components includes one or more of storage servers, application servers, switches, and other electronic devices.

18. The tank assembly of claim 14, wherein the tank is elliptical.

* * * * *